United States Patent [19]

Guisinger

[11] Patent Number: 4,521,818
[45] Date of Patent: Jun. 4, 1985

[54] ONE PLUS DOUBLE OMEGA SQUARED RADIO FREQUENCY EQUALIZER

[75] Inventor: Barrett E. Guisinger, Saratoga, Calif.

[73] Assignee: Sony Corporation, Tokyo, Japan

[21] Appl. No.: 462,547

[22] Filed: Jan. 31, 1983

Related U.S. Application Data

[63] Continuation-in-part of Ser. No. 324,773, Nov. 25, 1981, Pat. No. 4,405,954.

[51] Int. Cl.$^3$ .................... G11B 5/45; G11B 5/02
[52] U.S. Cl. ........................ 360/65; 333/18; 333/28 T
[58] Field of Search ............... 360/65, 67; 333/28 R, 333/28 T, 18

[56] References Cited

U.S. PATENT DOCUMENTS 4,371,901 2/1983 Shah ........................ 360/65

Primary Examiner—Vincent P. Canney
Attorney, Agent, or Firm—Philip M. Shaw, Jr.

[57] ABSTRACT

A circuit for selectively combining an input signal with a selected fraction of the input signal, twice differentiated, is comprised of two amplifier circuits, each having two input stages and a dual output stage with one output stage of each amplifier circuit being gain controllable in response to a control signal. One of the gain controllable output stages of one amplifier and the non-gain controlled output stage of the other amplifier are connected to a single combined output terminal. The other output stages are connected to a circuit ground. An input signal is supplied to one input stage of each amplifier circuit and the same input signal, after being double differentiated by means of an inductor and capacitor, is supplied in noninverted form to the other input stage of one of the amplifier circuits and is supplied in inverted form to the other input stage of the other amplifier circuit. By a suitable choice of a control signal to the gain controllable output stages, the signal appearing at the output terminal will be some fraction of the double differentiated input signal either added to or subtracted from the input signal.

6 Claims, 1 Drawing Figure

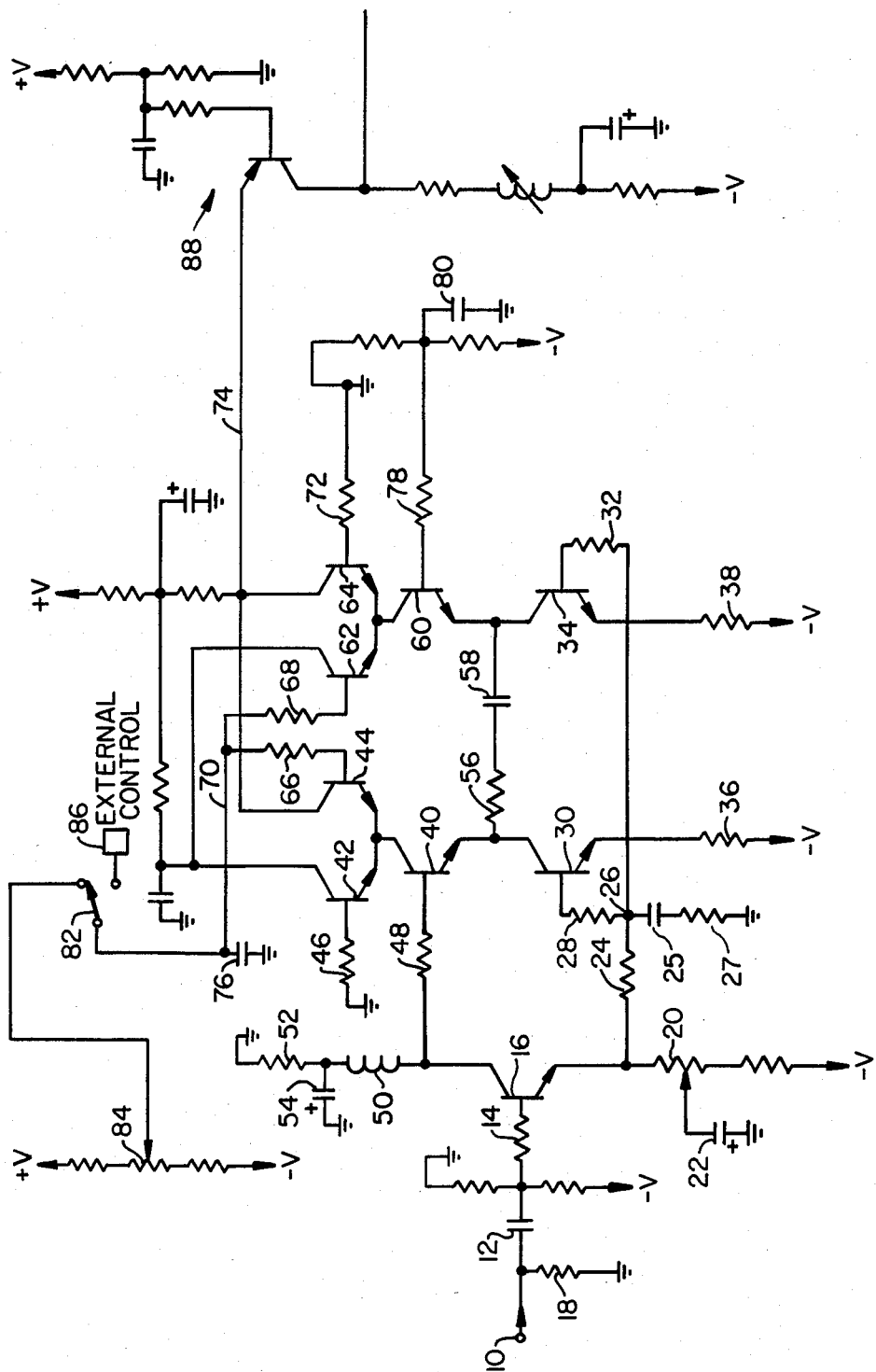
FIG._1.

ONE PLUS DOUBLE OMEGA SQUARED RADIO FREQUENCY EQUALIZER

CROSS REFERENCE TO RELATED APPLICATION

This application is a continuation-in-part of my co-pending, prior filed application Ser. No. 324,773, filed Nov. 25, 1981 now U.S. Pat. No. 4,405,954 and entitled Radio Frequency Equalizer.

TECHNICAL FIELD

This invention relates to a control circuit for mixing together, in variable amounts, an input signal and the input signal after it has been double differentiated, and more particularly to such a control circuit when embodied in an RF equalizer.

BACKGROUND ART

It is desirable in the reproduction of recorded signals, particularly signals recorded on magnetic media, to compensate for frequency response roll-off. In videotape recording or reproducing this must be corrected before the signal enters the frequency demodulator. Even in an audio system it is desirable and sometimes necessary to correct for the amplitude roll-off with frequency.

In the past, this has been corrected by an equalizer circuit which utilizes a time delay having a plurality of time delay elements connected in series. An improved form of such a circuit is described in my above-identified co-pending patent application.

In situations where the reproduction of the recorded signals involve the use of a plurality of magnetic recording heads, such as the rotating magnetic heads in a videotape recording and reproducing apparatus, the roll-off compensation is different for each magnetic head. Also, it is sometimes desirable to shift the range over which the frequency response is to be compensated to produce a flat response.

While there exist prior art methods which would be suitable for controlling an RF equalizer circuit, these prior art methods cause a control signal to be introduced in the signal being reproduced from the magnetic media. This is obviously undesirable. What is required is a controllable RF equalizer which does not superimpose the equalization control signal upon the output signal. The circuit of my above referenced co-pending application solves this problem, but with greater complexity than that of the present invention.

DISCLOSURE OF THE INVENTION

The present invention solves the problem of combining an input signal with its twice differentiated form, without introducing a control signal component, by providing essentially two parallel signal control branches, each branch having a dual output stage and first and second input stages whose outputs are series connected. One output stage of each branch is shunted to the circuit ground (or, in another embodiment, is connected to a second alternative output terminal). The other output stage of each branch is connected to a first, or primary output terminal. The input signal is applied to the first input stages of both branches. The input signal is twice differentiated by a double differentiation means and is supplied in inverted form to the second input stage of one of the branches and in non-inverted form to the second input stage of the other branch.

The branch output stages are controllable by a control signal supplied via a control line such that when a control signal of a predetermined magnitude and polarity is applied to the control line, one of the output stages of one branch will shunt its output signal to the circuit ground (or the auxiliary output) while the output stage of the other branch provides an output signal to the primary output terminal. If a control signal of a different polarity is applied to the output stages, the reverse process will take place.

Since the portion of the signal which is shunted to the circuit ground (or the auxiliary output terminal), in one branch is roughly equal to the portion of the signal which is shunted to the output terminal in the other branch, the overall amplitude of the output signal is not affected by the control signal and thus the control signal does not appear as a part of the signal at the primary output terminal. The output will thus be equal to $V_{in}(1 \pm K\omega^2)$ where K is proportioned to the magnitude and polarity of the control signal.

In the preferred embodiment, the combining circuit comprises first, second, third, fourth, fifth, sixth, seventh, eighth and ninth transistors, each having its own base, collector and emitter. Also provided in the circuit is a signal input terminal and a control signal input terminal. Means are provided for connecting the collectors of the first and fifth transistors to the combined output terminal, for connecting the collectors of the second and sixth transistors to the circuit ground, and for connecting the bases of the second and fifth transistors to the circuit ground. Means are also provided for connecting the bases of the first and sixth transistors to the control signal input terminal, for connecting the emitters of the first and second transistors to the collector of the third transistor, and for connecting the emitters of the sixth and fifth transistors to the collector of the seventh transistor.

The emitter of the third transistor is connected to the collector of the fourth transistor, and the emitter of the seventh transistor is connected to the collector of the eighth transistor. The emitters of the fourth and eighth transistors are coupled to the circuit ground. The bases of the fourth and eighth transistors are connected to the emitter of the ninth transistor whose base is connected to the first signal input terminal. The base of the third transistor is connected to the collector of the ninth transistor and is also connected to the circuit ground through a coil, which performs the first differentiation of the input signal. A load resistance in series with a capacitor is connected between the collectors of the fourth and eighth transistors. The base of the seventh transistor is coupled to the circuit ground. Biasing means supplies biasing voltages to the emitters, bases and collectors of all of the transistors.

It is therefore an object of the present invention to provide a control circuit for combining an input signal with its second derivative without introducing a control signal as part of the output signal.

It is still another object of the invention to provide an RF equalizer circuit having fewer and less costly components than prior art such devices.

It is still another object of the invention to provide an improved RF equalizer circuit for use with magnetic media recorders/players.

It is yet a further object of the invention to provide an improved RF equalizer circuit for use with a videotape recorder/player.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWING

The FIGURE is a schematic diagram of an RF equalizer circuit according to the invention.

BEST MODE FOR CARRYING OUT THE INVENTION

A terminal 10, for receiving the input signal, is connected through a capacitor 12 in series with a resistor 14 to the base of an NPN transistor 16. The terminal 10 is also connected to a circuit ground through a resistor 18. The emitter of transistor 16 is connected through a potentiometer 20 to a bias source −V. The moving arm of the potentiometer 20 is connected through a capacitor 22 to the circuit ground.

The emitter of transistor 16 is also connected through a resistor 24 to a junction point 26. The junction point 26 is connected to the circuit ground through a resistor 25 in series with a capacitor 27. The junction 26 is also connected through a resistor 28 to the base of an NPN transistor 30 and through a resistor 32 to the base of an NPN transistor 34. The emitters of the transistors 30 and 34 are connected, respectively, through resistors 36 and 38 to the −V supply.

The transistors 30 and 34 constitute the bottom halves of two parallel branches of the signal controlling circuit. The collector of the transistor 30 is connected to the emitter of an NPN transistor 40. The collector of transistor 40 is connected to the emitters of separate NPN transistors 42 and 44 which make up the top half of one of the branches. The base of transistor 42 is connected through a resistor 46 to the circuit ground. The base of transistor 40 is connected through a resistor 48 to the collector of transistor 16.

The collector of transistor 16 is also connected through an inductor 50 in series with a resistor 52 to the circuit ground. A capacitor 54 is connected in parallel with the resistor 52. As will be explained in further detail hereinafter, the inverted input signal appearing at the collector of transistor 16 is differentiated by the inductor 50.

A resistor 56 is connected in series with a capacitor 58 between the collectors of transistors 30 and 34. This series connection performs a second differentiation of the input signal; i.e., it differentiates the input signal which has already been differentiated by the coil 50. The collector of transistor 34 is also connected to the emitter of an NPN transistor 60 whose collector is connected to the emitters of two NPN transistors 62 and 64 which make up the top half of the other branch.

The bases of the transistors 44 and 62 are connected through separate resistors 66 and 68, respectively, to a control signal input line 70. The base of the transistor 64 is connected through a resistor 72 to the circuit ground. The collectors of the transistors 44 and 64 are connected together to a combined signal output line 74 and the collectors of the transistors 44 and 62 are connected together to one side of a capacitor 76 whose other side is connected to the circuit ground.

The base of transistor 60 is connected through a series connection of the resistor 78 and a capacitor 80 to the circuit ground. The control signal input line 70 is selectively connected through a switch 82 either to an adjustable bias source 84 or to an external control signal input terminal 86.

In operation, the non-inverted input signal, derived from the emitter of the buffer transistor 16, is supplied to the bases of the dual transistors 30 and 34. When all of the transistors 42, 44, 62 and 64 are conductive, this input signal appears at their collectors. Since the collectors of the transistors 42 and 62 are connected to the circuit ground through the capacitor 76, the signal at these collectors is effectively not used and only the signal at the collectors of transistors 44 and 64 reaches the combined signal output line 74.

The emitter resistors 36 and 38 of the transistors 30 and 34 are the same value so that the same magnitude of signal current appears out of their collectors, and in phase. If a control voltage is applied to the control signal line 70 which is very positive, then all signal current from the transistor 30, appearing at its collector, will appear at the collector of transistor 44. Thus the signal travels up through the transistor 40 and through the transistor 44 to the output signal line 74. The corresponding signal current traveling up through the transistor 60 from the collector of transistor 34 will go out through the transistor 62 to the circuit ground, since the transistor 62 is much more conductive than the transistor 64.

If a control signal having a negative polarity is applied to the control signal line 70, then the opposite result will occur. The transistor 44 will become far less conductive than the transistor 42, thus all of the signal traveling through the transistor 40 will be shunted to the circuit ground whereas the signal traveling through the transistor 60 will appear at the collector of transistor 64 connected to the combined output line 74. No matter what is done with the control voltage applied to line 70, it will have no effect on the basic level of the signal out on line 74. The direct current operating point of the signal on line 74 will not be changed, regardless of variations in the control signal input to line 70.

The inverted and once differentiated input signal appearing at the base of the transistor 40 constitutes a "second" input signal and is supplied to the left hand branch of the control circuit comprised of the transistor 40 and the transistors 42 and 44, and through the resistor 56 and capacitor 58 to the right hand branch of the control circuit which includes the transistors 60, 62 and 64. The resistor 56 and the capacitor 58, however, cause a second differentiation to take place in both branches. This signal will appear in inverted form at the collectors of the transistors 42 and 44 and in noninverted form at the collectors of the transistors 62 and 64. Thus if the control signal applied to the signal line 70 is chosen so that the transistors 42, 44, 62 and 64 are equally conductive, then there will be no net output on the line 74 due to the signal derived at the output of transistors 16, since the inverted and noninverted signals will cancel each other out.

If, however, the control signal applied to the line 70 is chosen such that the transistors 44 and 62 are far more conductive than the transistors 42 and 64, then the noninverted form of the double differentiated input signal will appear on the output line 74 and the inverted form of the double differentiated input signal will be shunted to ground. The net result is that the double differentiated form of the input signal is being added to the input signal.

Conversely, if the signal supplied to the line 70 is chosen such that the transistors 42 and 64 are far more conductive than the transistors 44 and 62, then the non-inverted form of the double differentiated input signal will be shunted to the circuit ground and the inverted form of the double differentiated input signal will be added to the input signal; i.e. the double differentiated form of the input signal will be subtracted from the input signal.

In the former case the result is a boosting characteristic to the equalization circuit whereas in the latter case it produces a rolling off characteristic. In both cases, the control voltage does not change the direct current operating point of the output current in any way and therefore it does not appear as part of the output signal.

It should be noted that the circuitry, generally designated by the reference numeral 88, which is connected to the output signal line 74 acts as a buffer in supplying the equalized radio frequency signal output to the remaining circuitry of the videotape recorder/reproducer (not shown).

All of the transistors described above are provided with suitable biasing by means of various resistors and power supplies in a well known manner as illustrated in the figure. Since the biasing is conventional, it will not be described in greater detail.

Control signal line 70 is supplied with a suitable control signal, selectively through a single pole double throw switch 82, either from an external control terminal 86 or an adjustable voltage source 84.

While in the above described embodiments the various transistors have been referred to as individual elements, in the preferred embodiment the transistors 30 and 34 are a dual transistor and the transistors 40, 42, 44, 60, 62 and 64 comprise an integrated circuit having a common substrate. This helps make the circuit more thermally stable, among other advantages, such as a lower manufacturing cost.

While there have been described above various arrangements of a control circuit in accordance with the invention for the purpose of illustrating the manner in which the invention is used to advantage, it will be appreciated that the invention is not limited thereto. Accordingly, any modification, variation or equivalent arrangement within the scope of the accompanying claims should be considered to be within the scope of the invention.

I claim:
1. A circuit for selectively combining an input signal with the same signal after double differentiation to produce a combined output signal in response to a control signal without introducing the control signal into the output signal, the circuit comprising
a first and a second amplifier circuit, each circuit having corresponding separate pairs of input stages and separate pairs of parallel connected, selectively gain controllable output stages driven by the input stages,
a first output terminal,
a second output terminal,
means for connecting corresponding ones of the output stages of the first and second amplifier circuits to supply their outputs to the first output terminal and for connecting the other output stages of each amplifier circuit to supply their outputs to the second output terminal,
control signal means for controlling the gains of opposite ones of the output stages of the first and second amplifier circuits, the other output stages having predetermined, fixed gains,
means for supplying an input signal to corresponding ones of the input stages of both the first and second amplifier circuits, and
double differentiation means for supplying a second derivative of the input signal in inverted form to the other input stage of the first amplifier circuit and in noninverted form to the other input stage of the second amplifier circuit.

2. A signal combining circuit as recited in claim 1 wherein for each amplifier the input stages have inputs and outputs and are connected in series by their outputs with the parallel output stages.

3. A signal combining circuit as recited in claim 2 further comprising a circuit ground and wherein the double differentiation means comprises an inductor connected between the input of said other input stage of said first amplifier and the circuit ground and a capacitor and a resistor connected in series between the outputs of said corresponding ones of said input stages of said first and second amplifiers and further comprising means for supplying the input signal to the input of said other input stage of said first amplifier.

4. A combining circuit for adding or subtracting an input signal to a selected fraction of the second derivative of the input signal in response to a control signal, the combining circuit comprising an input terminal for receiving an input signal, a control signal input terminal, an output terminal, a circuit ground, first, second, third, fourth, fifth, sixth, seventh and eighth transistors, each having its own base, collector and emitter, means for connecting the collectors of the first and fifth transistors to the output terminal, means for connecting the collectors of the second and sixth transistors to the circuit ground, means for connecting the bases of the second and fifth transistors to the circuit ground, means for connecting the bases of the first and sixth transistors to the control signal input terminal, means for connecting the emitters of the first and second transistors to the collector of the third transistor, means for connecting the emitter of the third transistor to the collector of the fourth transistor, means for connecting the emitter of the seventh transistor to the collector of the eighth transistor, means for coupling the emitters of the fourth and eighth transistors to the circuit ground, means for connecting a load resistance and a capacitor in series between the collectors of the fourth and eighth transistors, means connected to the input terminal for supplying the noninverted input signal to the bases of the fourth and eighth transistors and the inverted input signal to the base of the third transistor, means for coupling the base terminal of the seventh transistor to the circuit ground, an inductor connected between the base of the third transistor and the circuit ground, and biasing means for supplying biasing voltages to the emitters, bases and collectors of the first, second, third, fourth, fifth, sixth, seventh and eighth transistors, whereby a signal is derived at the output terminal which is representative of a signal supplied to the input terminal plus or minus a portion of the second differentiated input signal, the magnitude of the portion being representative of the magnitude and polarity of the signal applied to the control signal input terminal.

5. A control circuit, as recited in claim 4, wherein the fourth and eighth transistors comprise a dual transistor having a common substrate.

6. A control circuit, as recited in claim 4, wherein the first, second, third, fifth, sixth and seventh transistors comprise an integrated circuit having a common substrate.

* * * * *